United States Patent
Watanabe

[11] Patent Number: 6,163,023
[45] Date of Patent: Dec. 19, 2000

[54] AMPLIFIED PHOTOELECTRIC TRANSDUCER AMPLIFIED SOLID-STATE IMAGE SENSOR AND METHOD FOR DRIVING AMPLIFIED PHOTOELECTRIC TRANSDUCER

[75] Inventor: Takashi Watanabe, Soraku-gun, Japan

[73] Assignee: Sharp Kabushiki Kaisha, Osaka, Japan

[21] Appl. No.: 09/208,361

[22] Filed: Dec. 10, 1998

[30] Foreign Application Priority Data

Dec. 15, 1997 [JP] Japan ..................................... 9-345472

[51] Int. Cl.[7] .............................. H04N 5/335; H01L 27/00
[52] U.S. Cl. .................................... 250/208.1; 250/214.1; 257/292; 348/241
[58] Field of Search .............................. 250/208.1, 214.1, 250/214 A; 257/290, 291, 292, 222, 225, 231; 348/241, 308, 294, 301

[56] References Cited

U.S. PATENT DOCUMENTS 5,892,540  4/1999  Kozlowski et al. ................. 250/208.1

OTHER PUBLICATIONS

Oba, Elji "A ¼ Inch 330k Square Pixel Progressive Scan CMOS Active Pixel Image Sensor" 1997, IEEE International Solid–State Circuits Conference, Section 98372.

*Primary Examiner*—Seungsook Ham
*Assistant Examiner*—Kevin Pyo
*Attorney, Agent, or Firm*—Dike, Bronstein, Roberts & Cushman, LLP; David G. Conlin

[57] ABSTRACT

An amplified photoelectric transducer of the present invention includes: a photoelectric transducer section for photoelectrically transducing incident light into an electric signal; a first MOS transistor for amplifying the electric signal; a second MOS transistor for resetting the photoelectric transducer section; and a third MOS transistor for reading out to a signal line the amplified electric signal. The photoelectric transducer section includes a signal charge storage section for storing a charge corresponding to the electric signal and a potential change detection section for detecting a potential change of the electric signal. The amplified photoelectric transducer further includes a fourth MOS transistor for switching the potential of the potential change detection section to a semiconductor substrate potential in response to an operation of the third MOS transistor.

17 Claims, 14 Drawing Sheets

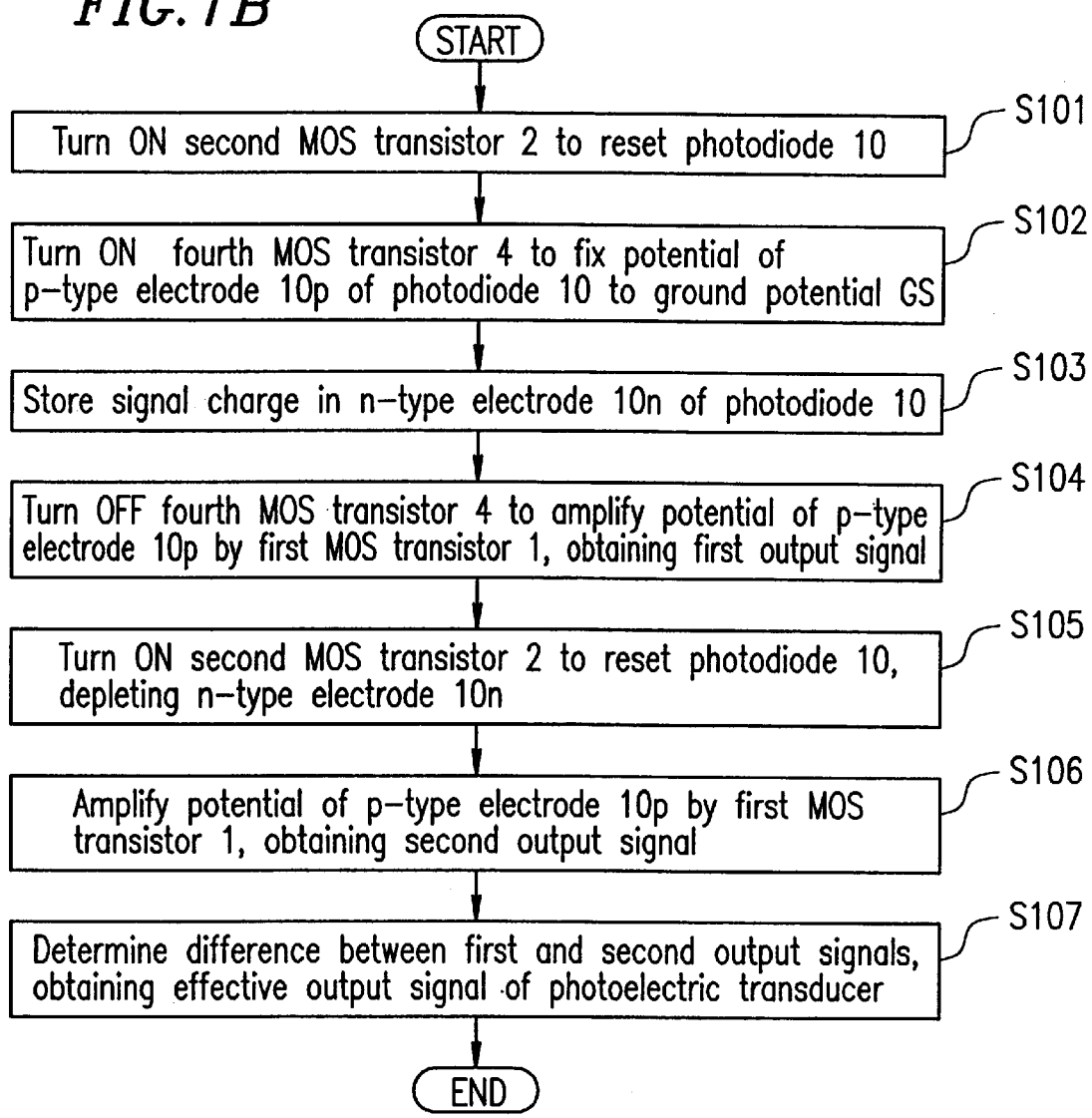

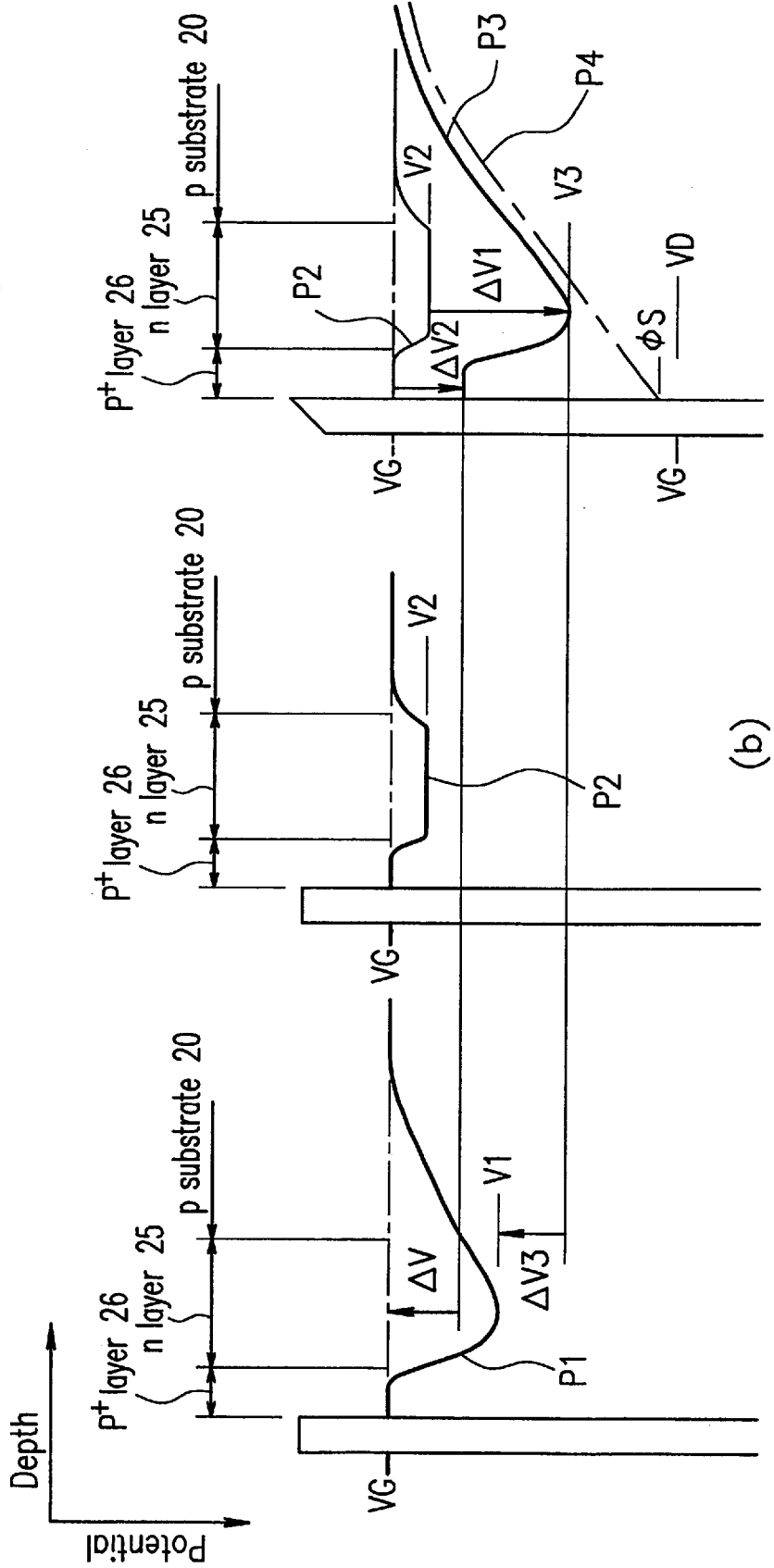

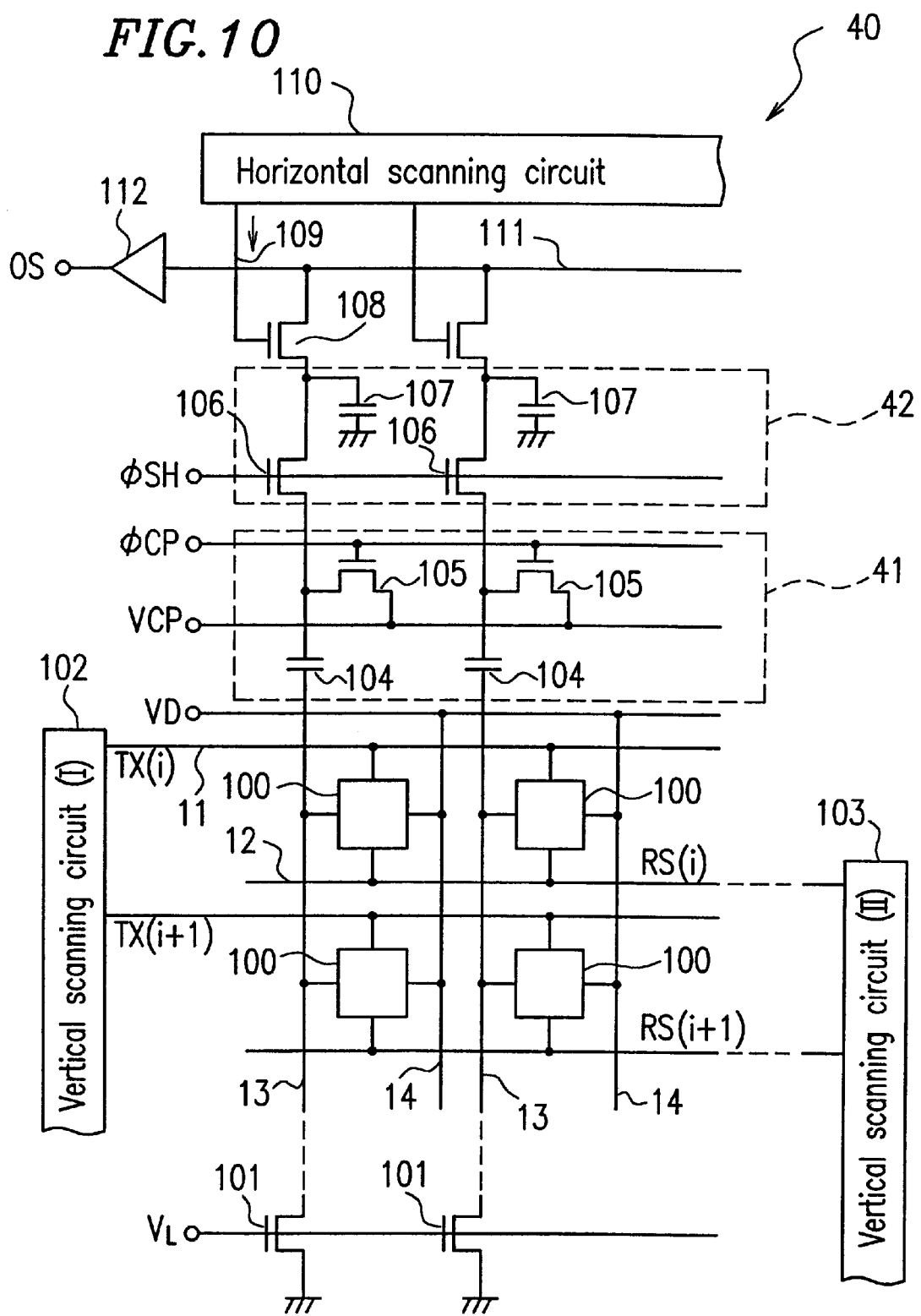

*PRIOR ART*   *PRIOR ART*

AMPLIFIED PHOTOELECTRIC TRANSDUCER AMPLIFIED SOLID-STATE IMAGE SENSOR AND METHOD FOR DRIVING AMPLIFIED PHOTOELECTRIC TRANSDUCER

BACKGROUND OF THE INVENTION

1. Field of the Invention

The present invention relates to an amplified photoelectric transducer having a novel pixel structure, an amplified solid-state image sensor including a plurality of such amplified photoelectric transducers arranged in a matrix, and a method for driving the amplified photoelectric transducer. More particularly, the present invention relates to an amplified photoelectric transducer capable of eliminating reset noise and obtaining a high-resolution video signal (image signal), an amplified solid-state image sensor including a plurality of such amplified photoelectric transducers, and a method for driving the amplified photoelectric transducer.

2. Description of the Related Art

Conventionally, an amplified solid-state image sensor has been proposed which has a plurality of pixels (or amplified photoelectric transducers) each having an amplification function and reading out a signal charge by a scanning circuit. For example, APS (Active Pixel Sensor) image sensors are known in the art. The APS image sensor employs an amplified photoelectric transducer-having a CMOS structure, and can be integrated with peripheral circuits such as a driving circuit or a signal processing circuit.

In the APS image sensor, however, it is necessary to provide a photoelectric transducer section, an amplification section, a pixel selection section and a reset section all within one amplified photoelectric transducer. Consequently, three or four n-type transistors are usually needed in addition to the photoelectric transducer section made of a photodiode (hereinafter, referred to also as a "PD").

FIG. 12 illustrates an amplified photoelectric transducer of an image sensor described in Mabuchi, et al., "¼-inch VGA-compatible 330,000-pixel CMOS image sensor" in the Technical Report of the Society of Image Information Media, IPU 97-13, March 1997. The amplified photoelectric transducer employs a PD+3T pixel structure, where each pixel includes a PD and three transistors.

More specifically, an amplified photoelectric transducer 200 is formed within a region surrounded by a read-out clock line 11, a reset clock line 12, a signal line 13 and a power line 14. The amplified photoelectric transducer 200 includes a photodiode 5, an amplification section 1 formed of an n-type MOS transistor, a reset section 2 and a pixel selection section 3.

FIG. 13A illustrates a two-dimensional pattern of the amplified photoelectric transducer 200 illustrated in FIG. 12. FIG. 13B is a cross-sectional view taken along line B—B in FIG. 13A. Referring to FIG. 13A, the amplification section 1, the reset section 2 and the pixel selection section 3 are aligned in one vertical direction.

In FIG. 13A, the photodiode 5, the n-type transistors 1, 2 and 3, and the lines 11, 12, 13 and 14 correspond to those in FIG. 12. The photodiode 5 which functions as a photoelectric transducer is formed by an n-layer 21 in a p-type substrate 20.

As described above, the transistors 1, 2 and 3 illustrated in FIGS. 12 and 13A are all n-type MOS transistors, while the photodiode 5 is a p-n junction diode. Thus, the image sensor can be easily produced by a standard CMOS process.

In the image sensor having such a pixel arrangement, as illustrated in FIGS. 12, 13A and 13B, however, when the photoelectric transducer section (the photodiode 5) is reset, reset noise is inevitably generated from thermal noise of the reset MOS transistor 2.

More specifically, at the beginning of each frame period for storing a signal charge, the reference potential of the photodiode 5 randomly fluctuates. Where the value of the fluctuation is represented by "$\Delta Q$" based on the amount of charge, while the capacitance of one entire photoelectric transducer section including the gate capacitance of the amplification MOS transistor 1 is represented by "CP", then the fluctuation value $\Delta Q$ can be represented as in Expression (1) below.

$$\Delta Q = \sqrt{(k \cdot T \cdot CP)} \qquad (1)$$

where k denotes Boltzmann's constant, and

T denotes an absolute temperature

Therefore, when a signal charge is read out from an amplified photoelectric transducer for every frame period, the signal charge contains reset noise due to the fluctuation $\Delta Q$. The reset noise among various pixels within one frame or among various frames within one pixel has no correlation with each other, and the reset noise appears on the screen as spatially and temporally random noise.

In order to cancel out the reset noise, it is necessary to determine the difference between an output signal at the beginning of a signal charge operation and that at the end of the signal charge operation within one frame. This requires a relative difference, rather than an absolute signal amount, thereby requiring the initial potential of each pixel to be stored for the frame period. This in turn requires a frame memory, thereby presenting a disadvantage in that the system structure of the image sensor needs to be substantially large.

When a digital memory is used for the frame memory, a quantization error in an A/D conversion is inevitable. When an analog memory is used for the frame memory, other noise occurs when converting the signal charge into an analog value to be stored.

For these reasons, it has been nearly impossible to completely eliminate the reset noise, and the elimination of such reset noise has been an ultimate goal in the field of APS CMOS image sensors.

SUMMARY OF THE INVENTION

According to one aspect of this invention, an amplified photoelectric transducer includes: a photoelectric transducer section for photoelectrically transducing incident light into an electric signal; a first MOS transistor for amplifying the electric signal; a second MOS transistor for resetting the photoelectric transducer section; and a third MOS transistor for reading out to a signal line the amplified electric signal. The photoelectric transducer section includes a signal charge storage section for storing a charge corresponding to the electric signal and a potential change detection section for detecting a potential change of the electric signal. The amplified photoelectric transducer further includes a fourth MOS transistor for switching the potential of the potential change detection section to a semiconductor substrate potential in response to an operation of the third MOS transistor.

In one embodiment of the invention, the amplified photoelectric transducer is provided on a semiconductor substrate of a first conductivity type. The photoelectric transducer section includes a photodiode. The photodiode includes a first layer of a second conductivity type provided on the semiconductor substrate and a second layer of the first conductivity type provided on a surface side of the semiconductor substrate with respect to the first layer. The first layer provides the signal charge storage section. The second layer provides the potential change detection section.

In one embodiment of the invention, the first MOS transistor, the second MOS transistor and the third MOS transistor each include a channel region of the second conductivity type. The fourth MOS transistor includes a channel region of the first conductivity type.

In one embodiment of the invention, the amplified photoelectric transducer further includes a pixel separation region having a same potential as the potential of the semiconductor substrate. The first layer and the second layer are separated from the pixel separation region via a gate electrode of the fourth MOS transistor and are in contact with a gate region of the second MOS transistor.

In one embodiment of the invention, the gate electrode of the second MOS transistor and the gate electrode of the fourth MOS transistor are respectively formed by different electrode layers and overlap each other via an insulation film.

In one embodiment of the invention, the amplified photoelectric transducer further includes a pixel separation region having a same potential as the potential of the semiconductor substrate. The second layer is separated from the pixel separation region via a gate electrode of the fourth MOS transistor and a portion of the first layer, and is in contact with a gate electrode of the second MOS transistor.

In one embodiment of the invention, respective gate electrodes of the first, second, third and fourth MOS transistors are formed in a single layer.

In one embodiment of the invention, the first MOS transistor, the second MOS transistor, the third MOS transistor and the first layer are serially connected to one another and are arranged in a folded pattern. The amplified photoelectric transducer is shaped into a substantially square shape as viewed from above.

In one embodiment of the invention, the first MOS transistor, the second MOS transistor, the third MOS transistor and the first layer are serially connected to one another and are arranged in a folded pattern. The amplified photoelectric transducer is shaped into a substantially square shape as viewed from above.

In one embodiment of the invention, the first MOS transistor, the second MOS transistor, the third MOS transistor and the first layer are serially connected to one another and are arranged in a folded pattern. The amplified photoelectric transducer is shaped into a substantially square shape as viewed from above.

In one embodiment of the invention, the first MOS transistor and the third MOS transistor are provided in a first region in the semiconductor substrate. The second MOS transistor, the fourth MOS transistor and the photoelectric transducer section are provided in a second region in the semiconductor substrate. An impurity layer of the first conductivity is provided in the first region, the impurity layer having an impurity concentration higher than an impurity concentration of the second region.

According to another aspect of this invention, an amplified solid-state image sensor includes a plurality of amplified photoelectric transducers of the present invention. The amplified photoelectric transducers are arranged in a matrix. A gate electrode of the third MOS transistor and a gate electrode of the fourth MOS transistor provided in each amplified photoelectric transducer are commonly connected by rows to a first driving line running in a first direction. A gate electrode of the second MOS transistor provided in each amplified photoelectric transducer is connected by rows to a second driving line running in the first direction. A source region of the third MOS transistor provided in each amplified photoelectric transducer is connected by columns to a signal line running in a second direction perpendicular to the first direction.

In one embodiment of the invention, the amplified solid-state image sensor further includes: a first vertical driving circuit connected to the first driving line; a second vertical driving circuit connected to the second driving line; and a horizontal scanning circuit for selecting the signal line and reading out the electric signal from the amplified photoelectric transducer to a horizontal signal line.

In one embodiment of the invention, the amplified solid-state image sensor further includes a correlated double sampling circuit provided between the amplified photoelectric transducer and the horizontal signal line.

According to still another aspect of this invention, a method for driving an amplified photoelectric transducer of the present invention includes: a first step of turning ON the fourth MOS transistor to connect a potential of the second layer to the semiconductor substrate potential, thereby storing a signal charge in the first layer; a second step of, while the signal charge is stored in the first layer, turning OFF the fourth MOS transistor to bring the potential of the second layer to a floating state, thereby applying the potential of the second layer at this point of time to a gate electrode of the first MOS transistor and thus obtaining a first output signal; a third step of, while maintaining the second layer in an electrically floating state, turning ON the second MOS transistor to reset and discharge the signal charge stored in the first layer to a power supply region, thereby applying the potential of the second layer immediately after the reset operation to the gate electrode of the first MOS transistor and thus obtaining a second output signal; and a fourth step of determining a difference between the first output signal and the second output signal to obtain an effective output signal of the amplified photoelectric transducer.

In one embodiment of the invention, the third step includes a fifth step of substantially depleting the first layer.

In one embodiment of the invention, the method further includes a seventh step of setting an impurity concentration of the first layer and a potential of the gate of the second MOS transistor at the reset operation so as to substantially deplete the first layer.

A function of the present invention will now be described.

The amplified photoelectric transducer of the present invention includes a first layer provided in a substrate having a conductivity opposite to that of the substrate and a second layer having the same conductivity as that of the substrate and provided on the first layer closer to the surface of the substrate. A signal charge is stored in the first layer. The second layer is connected to the gate electrode of an amplification MOS transistor, and in turn to a substrate potential via a fourth switching MOS transistor. The term "substrate" as used herein refers not only to a semiconductor substrate but also to those having a relatively large thickness including a well layer formed in the surface portion thereof.

After a signal charge is stored, the second layer is brought to a floating state, thereby resetting the signal charge of the first layer via the second MOS transistor. Thus, as the potential of the first layer changes, the potential of the second layer also changes accordingly.

If the first layer is substantially depleted immediately after it is reset, the potential of the first layer at that point of time is a constant value which is determined by the first layer itself for reasons which will be set forth in the description of the preferred embodiments below. In other words, the potential of the first layer becomes a constant value which does not contain the thermal noise of the reset MOS transistor. Accordingly, the potential of the second layer immediately after it is reset also does not contain reset noise. Thus, the potential change of the second layer before and after the reset operation purely represents a signal without substantial reset noise.

Therefore, the signal (video signal) can be amplified by the first amplification MOS transistor and selectively read out by the third pixel selection MOS transistor, whereby the obtained difference between the potential of the signal before the reset operation and that after the reset operation represents a net signal without substantial reset noise.

The potential difference before and after the reset operation, as a net signal without substantial reset noise, can be obtained easily by providing a correlated double sampling circuit (hereinafter, referred to simply as a "CDS circuit") along a signal line. In other words, when the signal is clamped at the potential immediately before the reset operation and then sampled and held at the potential immediately after the reset operation, the obtained signal represents the potential difference and thus a net signal.

In the above operation, during a pixel read operation, the third MOS transistor is ON while the fourth MOS transistor is OFF, whereby the polarity of the third MOS transistor and that of the fourth MOS transistor are opposite to each other. Therefore, it is possible to apply a single common clock to the gate electrode of the third MOS transistor and to the gate electrode of the fourth MOS transistor.

As described above, the amplified solid-state image sensor of the present invention which includes a plurality of the amplified photoelectric transducers of the present invention arranged in a matrix clearly differs in terms of the circuit configuration from the conventional amplified solid-state image sensor in that the fourth MOS transistor is additionally provided. It may appear to introduce some structural complication.

However, since the third MOS transistor and the fourth MOS transistor share the same clock, the amplified photoelectric transducer of the present invention can be configured in substantially the same manner as the conventional amplified photoelectric transducer. In other words, the amplified photoelectric transducers of the present invention can be arranged in a matrix in substantially the same manner as the conventional amplified photoelectric transducers. Thus, there is no structural complication introduced by the present invention.

Moreover, in the amplified solid-state image sensor of the present invention, if the fourth MOS transistor is maintained ON, thereby keeping the potential of the second layer at the substrate potential, during a signal charge operation, channels of the fourth MOS transistor are filled with a large number of carriers of the substrate, whereby the channel surfaces are inactivated, respectively. As a result, it is possible to suppress generation of a dark current.

Thus, the invention described herein makes possible the advantages of: (1) providing an amplified photoelectric transducer capable of substantially eliminating reset noise by employing a simple pixel arrangement; (2) an amplified solid-state image sensor including such amplified photoelectric transducers arranged in a matrix; and (3) a method for driving such an amplified photoelectric transducer.

These and other advantages of the present invention will become apparent to those skilled in the art upon reading and understanding the following detailed description with reference to the accompanying figures.

BRIEF DESCRIPTION OF THE DRAWINGS

FIG. 1B is a flow chart illustrating a method for driving the amplified photoelectric transducer of the present invention;

FIGS. 4A, 4B and 4C illustrate potential diagrams of the amplified photoelectric transducers illustrated in FIGS. 2A and 3A;

FIG. 10 is a circuit diagram illustrating an amplified solid-state image sensor according to an example of the present invention;

DESCRIPTION OF THE PREFERRED EMBODIMENTS

The present invention will now be described by way of illustrative examples with reference to the accompanying figures.

EXAMPLE 1

Figure 1A:
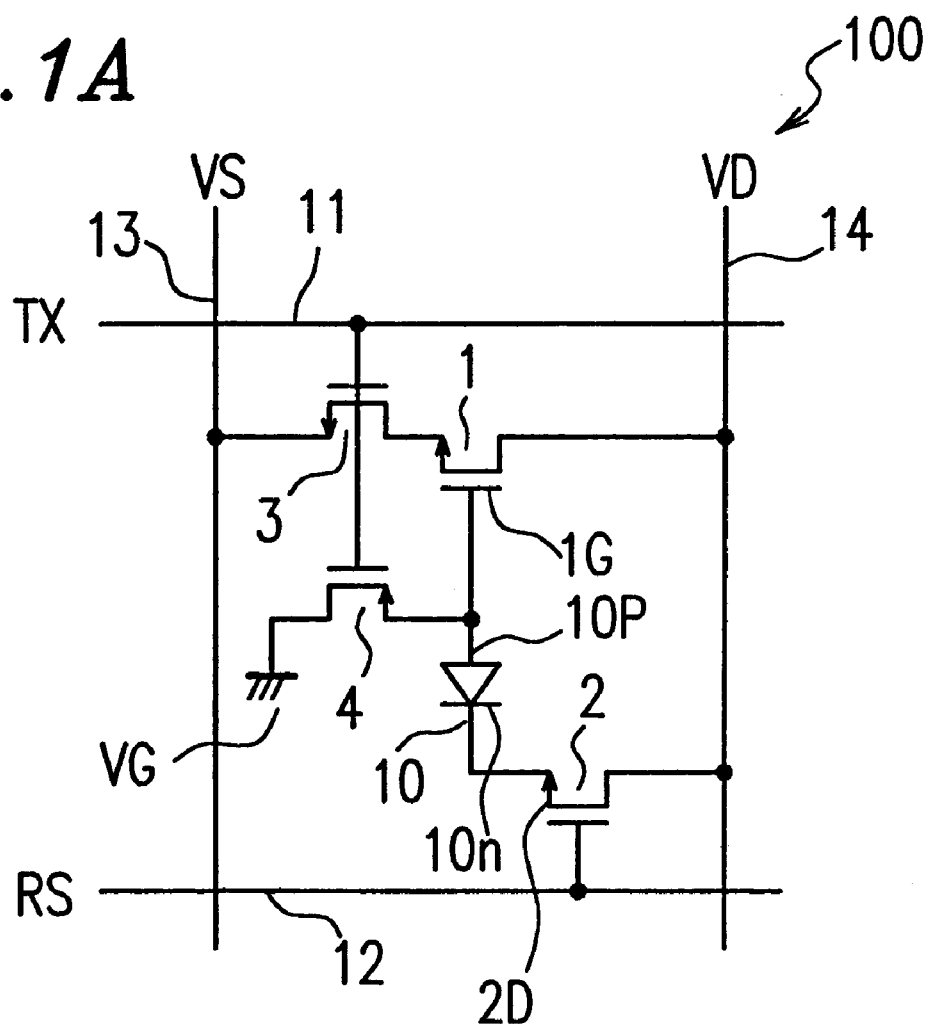
FIG. 1A is a circuit diagram illustrating an amplified photoelectric transducer of the present invention.
Figure 12:
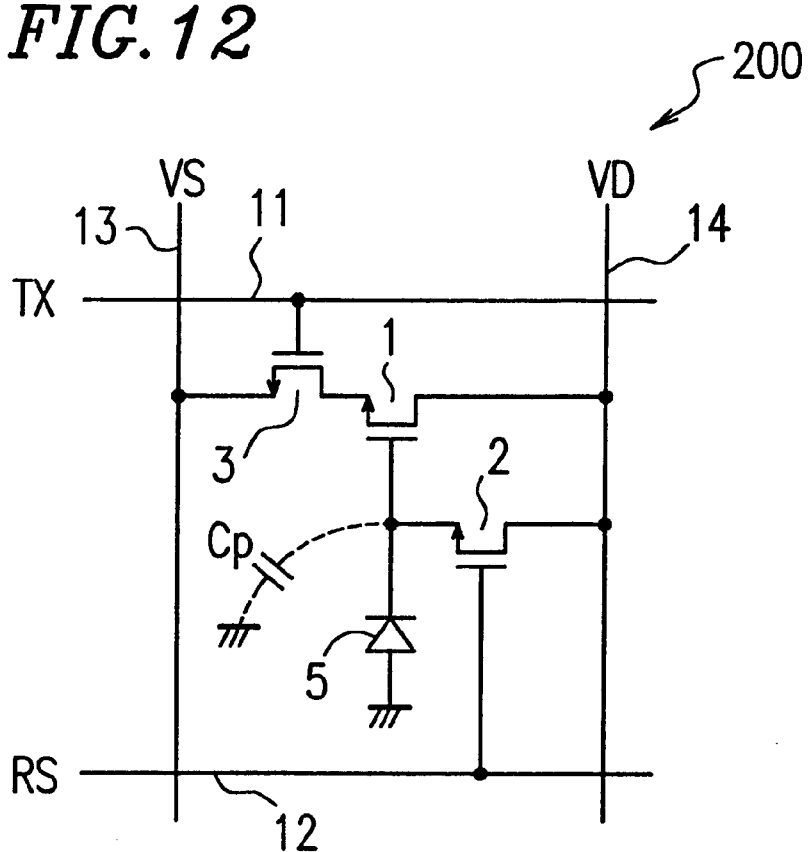
FIG. 12 is a circuit diagram illustrating a conventional amplified photoelectric transducer.
Figure 13A:
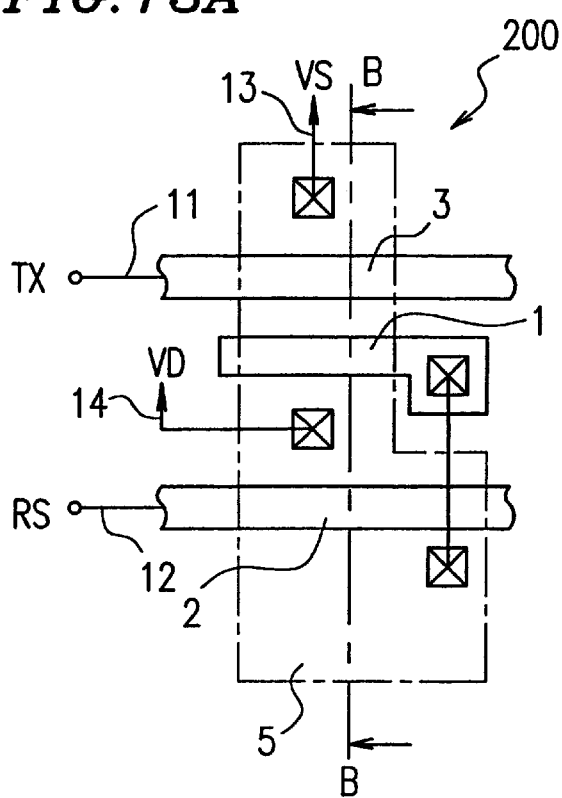
FIG. 13A is a diagram illustrating a two-dimensional pattern of the conventional amplified photoelectric transducer illustrated in FIG. 12.
Figure 13B:
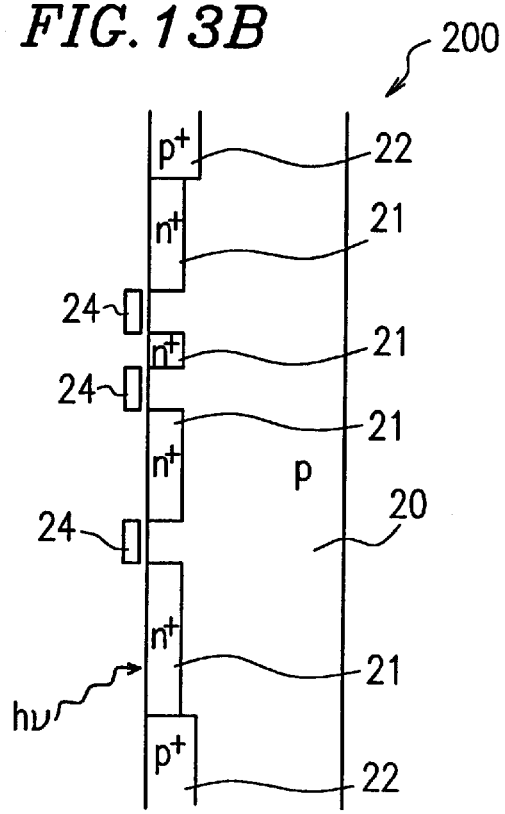
FIG. 13B is a cross-sectional view taken along line B—B in FIG. 13A.

FIG. 1A is a block diagram illustrating an amplified photoelectric transducer 100 according to an example of the present invention. The amplified photoelectric transducer 100 is formed within a region surrounded by the read-out clock line 11, the reset clock line 12, the signal line 13 and the power line 14. The amplified photoelectric transducer 100 includes the first amplification MOS transistor 1, the second reset MOS transistor 2 and the third pixel selection MOS transistor 3 which are aligned serially. The structure so far is similar to that of the conventional example illustrated in FIG. 12.

In addition, however, the amplified photoelectric transducer 100 of the present invention further includes a p-n junction photodiode 10 as a photoelectric transducer section connected between the first amplification MOS transistor 1 and the second reset MOS transistor 2. The amplified photoelectric transducer 100 also includes a p-channel fourth switching MOS transistor 4.

The p-n junction photodiode 10 includes an n-type electrode 10n for storing a signal charge and a p-type electrode 10p for detecting a potential change. The p-type electrode 10p (opposite to the side of the p-n junction photodiode 10 on which a signal charge is stored) is connected to a gate electrode 1G of the first MOS transistor 1. The fourth MOS transistor 4 switches the p-type electrode 10p to the semiconductor substrate potential (hereinafter, referred to also as a "ground potential GS").

A method for driving the amplified photoelectric transducer 100 will now be described. FIG. 1B is a flow chart illustrating a method for driving the amplified photoelectric transducer 100. Referring to FIGS. 1A and 1B, a signal RS applied to the reset clock line 12 goes high, thereby turning ON the second reset MOS transistor 2. In turn, a signal charge (electrons) stored in the n-type electrode 10n of the p-n junction photodiode 10 is discharged to an electrode VD of the power line 14, thereby resetting the p-n junction photodiode 10 (S101).

Then, a signal TX applied to the read-out clock line 11 goes low, thereby turning OFF the third MOS transistor 3. In response to this, the fourth MOS transistor 4 is turned ON. Thus, the potential of the p-type electrode 10p of the p-n junction photodiode 10 is fixed at the ground potential GS (S102). Thereafter, incident light is photoelectrically transduced by the p-n junction photodiode 10, and the obtained signal charge is stored in the n-type electrode 10n (S103).

Signal detection is performed as follows. First, the signal TX applied to the read-out clock line 11 goes high, thereby turning ON the third pixel selection MOS transistor 3. In response to this, the fourth MOS transistor 4 is turned OFF. The p-type electrode 10p of the p-n junction photodiode 10 is brought to a floating state, and the first MOS transistor 1 amplifies the potential of the p-type electrode 10p of the p-n junction photodiode 10. At this time, since the third MOS transistor 3 is ON, the amplified signal is read out to the signal line 13, thereby obtaining a first output signal (S104).

While the potential of the p-type electrode 10p of the p-n junction photodiode 10 is at the floating state, the second MOS transistor 2 is turned ON. In turn, a signal charge stored in the n-type electrode 10n of the p-n junction photodiode 10 is discharged to an electrode VD of the power line 14, thereby resetting the p-n junction photodiode 10 (S101). The n-type electrode 10n is depleted (S105). The potential of the p-type electrode 10p of the p-n junction photodiode 10 immediately after the reset operation is amplified by the first MOS transistor 1. The amplified signal is read out to the signal line 13 via the third MOS transistor 3, thereby obtaining a second output signal (S106). By the above-described operation, a signal charge difference before and after the signal charge storage operation can be obtained on the signal line 13. The effective output signal of the amplified photoelectric transducer 100 can be obtained by determining the difference between the first output signal and the second output signal (S107).

If the n-type electrode 10n of the p-n junction photodiode 10 is substantially depleted immediately after resetting the p-n junction photodiode 10, the signal charge difference before and after storage represents a net signal without substantial reset noise.

Figure 2A:
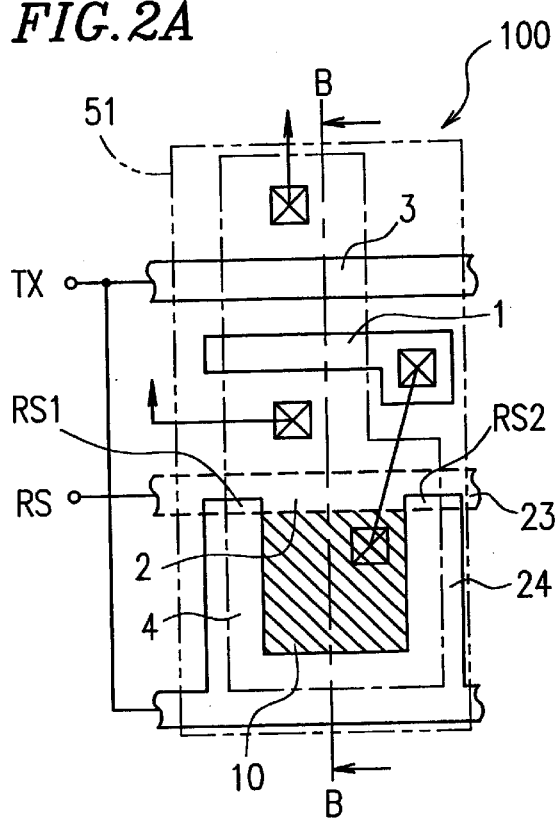
FIG. 2A is a diagram illustrating a two-dimensional pattern of the amplified photoelectric transducer illustrated in FIG. 1A.
Figure 2B:
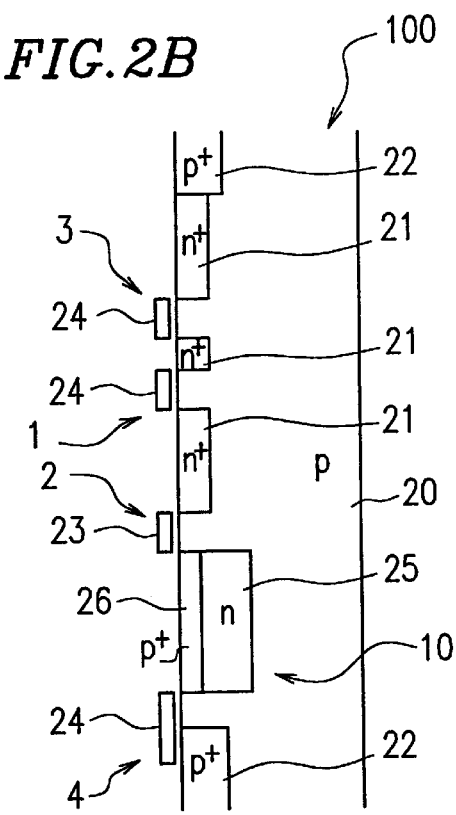
FIG. 2B is a cross-sectional view taken along line B—B in FIG. 2A.

Referring to FIGS. 2A and 2B, a two-dimensional pattern and a cross section of the amplified photoelectric transducer 100 will be described. Referring to FIG. 2A, in the amplified photoelectric transducer 100, the p-n junction photodiode 10 and the first to third MOS transistors 1 to 3 are aligned serially, so that a cell 51 is formed into a rectangular shape. Elements in FIGS. 2A and 2B having like reference numerals to those shown in FIG. 1A will not be described below further.

Referring to FIG. 2B, the p-n junction photodiode 10 includes an n layer 25 provided on the p-type substrate 20 and a p+ layer 26 provided on the n layer 25. The fourth MOS transistor 4 includes a p+ layer 22 and a p+ layer 26, as a p-type channel region. The p+ layer 22 is a pixel separation region which is set at the same potential as the p-type substrate 20. The n layer 25 and the p+ layer 26 are both separated from the p+ layer 22 via an electrode 24. Each of the first to third MOS transistors 1 to 3 has the n+ layer 21 as an n-type channel region.

The gate electrode 24 of the fourth MOS transistor 4 is made from an electrode layer different from that of a gate electrode 23 of the second MOS transistor 2. As illustrated in FIG. 2A, the gate electrode 24 and the gate electrode 23 overlap each other in regions RS1 and RS2 via an insulation layer (not shown). While each of the gate electrodes of the first MOS transistor 1 and the third MOS transistor 3 may be either the gate electrode 23 or the gate electrode 24, it is the gate electrode 24 in the example illustrated in FIG. 2B. The gate electrode 24 of the first MOS transistor 1, the gate electrode 23 of the second MOS transistor 2, the gate electrode 24 of the third MOS transistor 3 and the gate electrode 24 of the fourth MOS transistor 4 are all formed in the same layer.

EXAMPLE 2

Figure 3A:
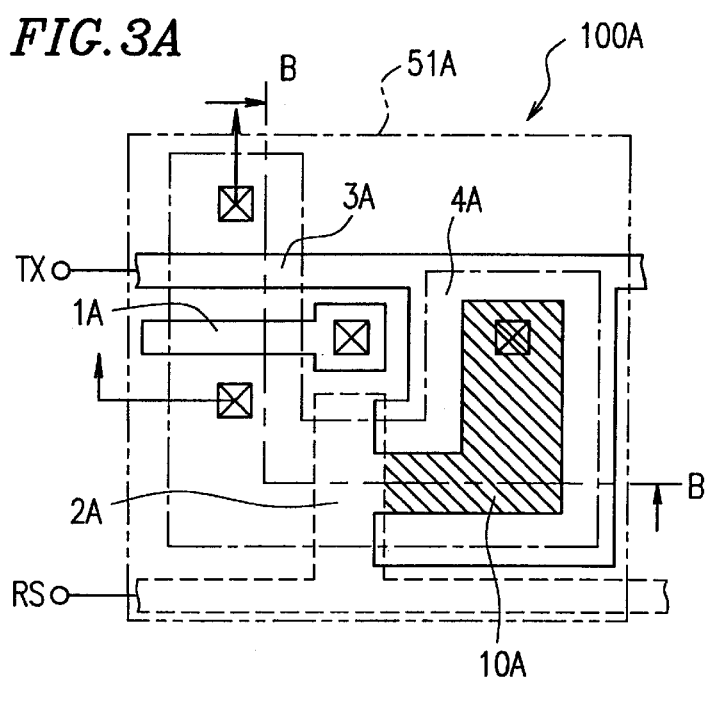
FIG. 3A is a diagram illustrating another two-dimensional pattern of the amplified photoelectric transducer illustrated in FIG. 1A.
Figure 3B:
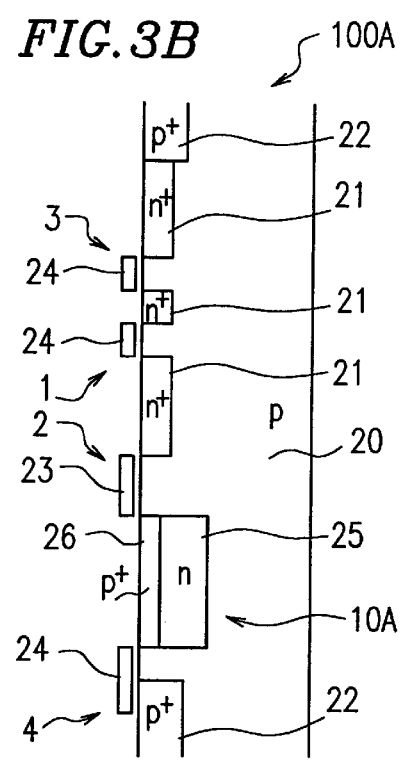
FIG. 3B is a cross-sectional view taken along line B—B in FIG. 3A.

FIGS. 3A and 3B illustrate an amplified photoelectric transducer 100A according to an example of the present invention. The amplified photoelectric transducer 100A is different from the amplified photoelectric transducer 100 of Example 1 in the arrangement of the p-n junction photodiode and the first to third MOS transistors. In Example 2, these elements are arranged in a more folded pattern, so that a cell 51A is formed into a substantially square shape. This pattern provides the following advantages (1)–(4).

(1) The amplified photoelectric transducer (e.g., a cell of an amplified solid-state image sensor) can be shaped into a substantially square shape, which is advantageous in increasing the pixel density of the sensor.

(2) Since the first to third transistors are arranged in a more folded pattern, the area of the photoelectric transducer section can be easily ensured.

(3) A third MOS transistor 3A and a fourth MOS transistor 4A can easily be arranged to share a gate electrode, thereby reducing the pixel size.

(4) A channel of a second reset MOS transistor 2A can have a sufficient length.

Other elements of the amplified photoelectric transducer 100A are substantially the same as those of the amplified photoelectric transducer 100. These elements are provided with like reference numerals and will not be described below further.

Referring to voltage potential diagrams illustrated in FIGS. 4A, 4B and 4C, an operation of the p-n junction photodiode 10 (10A), the second MOS transistor 2 (2A) and the fourth MOS transistor 4 (4A) of the amplified photoelectric transducer 100 (10A), as illustrated in FIGS. 2A and 2B (3A and 3B), will further be described.

In FIGS. 4A, 4B and 4C, the horizontal axis represents the depth from the surface of the p-type substrate 20, and the vertical axis represents the potential. Solid lines P1, P2 and P3 each represent the potential of the p-n junction photodiode 10 (10A), and a one-dot chain line P4 represents the potential of the second MOS transistor 2 (2A) and the fourth MOS transistor 4 (4A). FIGS. 4A, 4B and 4C correspond to, respectively, immediately after a reset operation, the end of a photoelectric transduction and storage operation, and during a read operation.

Referring to FIG. 4A, a reset operation is performed to discharge the signal charge stored in the n layer 25 (n-type electrode 10n) of the p-n junction photodiode 10 (10A) to a drain 2D (FIG. 1A) of the second MOS transistor 2 (2A), thereby substantially depleting the n layer 25 (a neutral region remains in the p+ layer 26). Then, the p+ layer 26 is fixed at a ground potential VG via the fourth MOS transistor 4 (4A). Reference character V1 denotes the potential of the n layer 25 at this point of time.

At this point of time, the second MOS transistor 2 (2A) is OFF and the fourth MOS transistor 4 (4A) is ON. The channel potentials thereof are illustrated commonly by a one-dot chain line.

Referring to FIG. 4B, a signal charge (electrons) generated through a photoelectric transduction by the p-n junction photodiode 10 (10A) is stored in the n layer 25. Thus, the potential of the n layer 25 is at V2 immediately before a read operation.

Positive holes created through the photoelectric transduction on the p-type substrate 20 side with respect to the deepest portion of the n layer 25 flow into the p-type substrate 20. Positive holes created on the surface side with respect to the deepest portion of the n layer 25 flow into the p+ layer 26. Since the p+ layer 26 and the p-type substrate 20 are fixed at the ground potential VG, the potentials thereof are not changed by the positive holes flowing thereinto.

Thereafter, referring to FIG. 4C, the fourth MOS transistor 4 (4A) is turned OFF and the second reset MOS transistor 2 (2A) is turned ON. The channel potentials thereof are illustrated commonly by a one-dot chain line P4.

The p+ layer 26 is brought to a floating state, and the second reset MOS transistor 2 (2A) is turned ON, thereby discharging the signal charge stored in the n layer 25 to the drain 2D (VD indicates the potential). Thus, as illustrated in FIG. 4C, the potential of the p-n junction photodiode 10 (10A) changes from P2 to P3, the potential of the n layer 25 changes by $\Delta V1$ from V2 to V3, and the potential of the p+ layer 26 changes by $\Delta V2$ from VG.

A net signal without substantial reset noise can be obtained by amplifying $\Delta V2$ by means of the first amplification MOS transistor 1 and reading out the amplified potential to the signal line 13 via the third pixel selection MOS transistor 3.

The reason for this is as follows. After a signal charge is stored in the n layer 25 of the p-n junction photodiode 10 (10A), when the p+ layer 26 is brought to a floating state so as to reset the signal charge stored in the n layer 25 via the second MOS transistor 2 (2A), the potential of the p+ layer 26 changes by $\Delta V2$ due to the potential change $\Delta V1$ of the n layer 25. If the n layer 25 is substantially depleted immediately after it is reset, the potential of the n layer 25 at that point of time is a substantially constant value V3 which is determined by itself.

In other words, the potential of the n layer 25 becomes a constant value which does not contain the thermal noise of the second reset MOS transistor 2 (2A). Accordingly, the potential of the p+ layer 26 immediately after it is reset also does not contain substantial reset noise. Thus, the potential change $\Delta V2$ of the p+ layer 26 before and after the reset operation purely represents a signal without substantial reset noise.

After the operation illustrated in FIG. 4C, the fourth MOS transistor 4 (4A) is turned ON, and the second MOS transistor 2 (2A) is turned OFF, thereby bringing the p+ layer 26 to the ground potential VG. Thus, the amplified photoelectric transducer 100 (100A) returns back to the state illustrated in FIG. 4A. Thereafter, the above-described operation is repeated.

Figure 5:
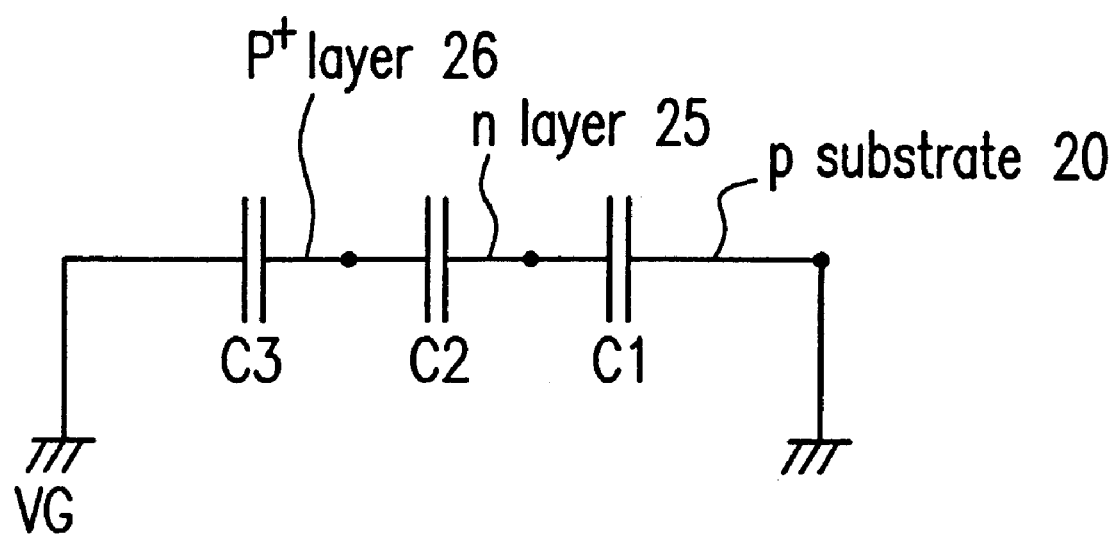
FIG. 5 is a diagram illustrating capacitances of the amplified photoelectric transducer illustrated in FIGS. 2A and 3A.

The relationship between $\Delta V1$ and $\Delta V2$ will now be described. Referring to FIG. 5, C1 denotes a capacitance between the p-type substrate 20 and the n layer 25, C2 denotes a capacitance between the channel of the n layer 25 and the p+ layer 26, and C3 denotes a capacitance between the p+ layer 26 and the ground potential VG. The capacitances C1 and C2 are each a junction capacitance, while the capacitance C3 is mainly the gate capacitance of the first MOS transistor 1 and the stray capacitance of an interconnection between the p+ layer 26 and the gate electrode 1G.

Relationship as in Expression (2) below holds between $\Delta V1$ and $\Delta V2$, where $k=C2/(C2+C3)$.

$$\Delta V2 = k \cdot \Delta V1 \qquad (2)$$

Since the amount of signal charge $\Delta Q$ stored in the n layer 25 can be represented by Expression (3) below, $$\Delta Q = C1 \cdot \Delta V1 + C2 \cdot (\Delta V1 - \Delta V2) \qquad (3)$$

relationship as in Expression (4) below holds between $\Delta V2$ and $\Delta Q$.

$$\Delta V2 = \Delta Q/(C3 + C1/k) \qquad (4)$$

It is shown by Expressions (2) and (4) above that the output signal $\Delta V2$ can be increased by reducing the capacitances C1 and C3 and increasing the capacitance C2.

For example, in the operation illustrated in FIGS. 4A to 4C, assuming that silicon is used as the semiconductor material, under Condition 1 below, State 1 results in terms of the intrinsic potential.

Condition 1

Impurity concentration of p-type substrate $20=1\times10^{15}$ cm$^{-3}$

Impurity concentration of n layer $25=1\times10^{16}$ cm$^{-3}$

Impurity concentration of p+ layer $26=1\times10^{17}$ cm$^{-3}$

Thickness of gate insulation film of second MOS transistor 2 (2A) and fourth MOS transistor 4 (4A)=14 nm Amount of signal charge stored in n layer 25 $\Delta Q=2.8\times10^{11}$ cm$^{-2}$

C2=C3

VG=5 V

State 1

V1=1.74 V

V2=0.5 V

V3=2.50 V $\Delta$V1=2.0 V $\Delta$V2=1.0 V $\Phi$S=4.84 V

As shown in Condition 1 and State 1, by appropriately setting the impurity concentrations, the thickness of the gate insulation film, the amount of signal charge and the potentials, it is possible to substantially deplete the n layer 25 by a reset operation, thereby obtaining an output signal of $\Delta$V2=1.0 V.

EXAMPLE 3

Under Condition 1 in Example 2, the impurity concentration of the p-type substrate is less than that in a case where an ordinary CMOS process is employed. In view of this, in Example 3, at least the first MOS transistor 1 and the third MOS transistor 3 are provided on a p+ layer 27 having a high impurity concentration, as illustrated in FIGS. 6A, 6B and 7A and 7B. As a result, there is provided an advantage in that the first and third MOS transistors 1 and 3 can be produced easily from an ordinary CMOS process.

Figure 6A:
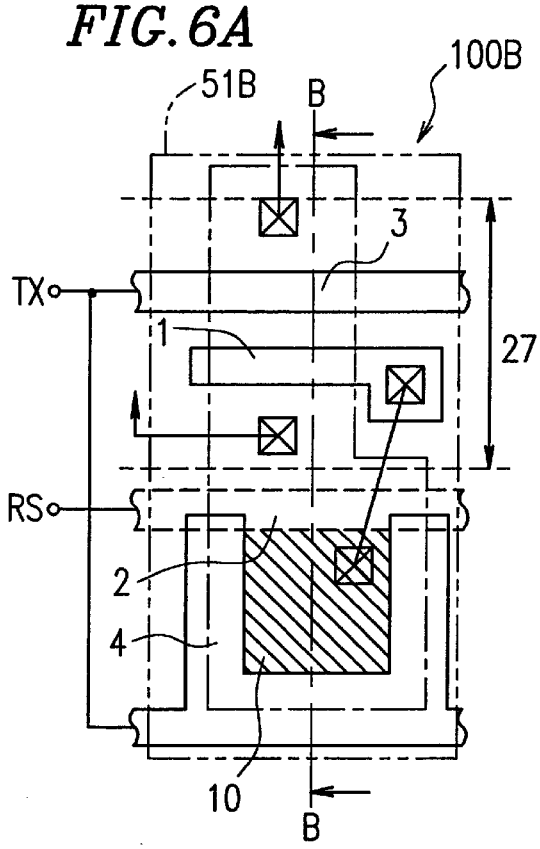
FIG. 6A is a diagram illustrating still another two-dimensional pattern of the amplified photoelectric transducer illustrated in FIG. 1A.
Figure 6B:
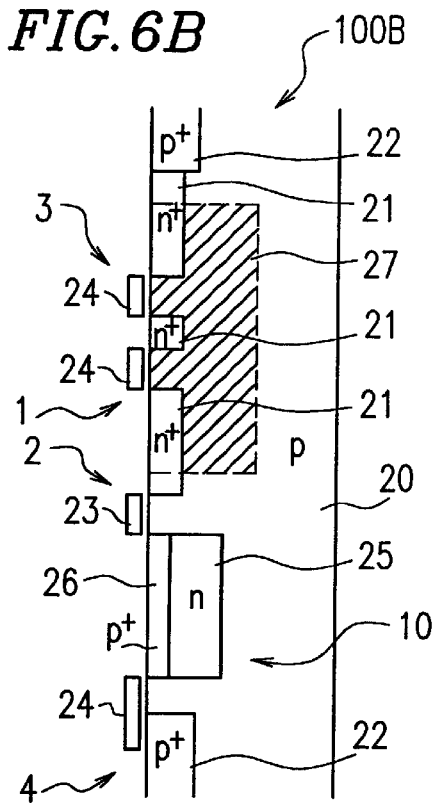
FIG. 6B is a cross-sectional view taken along line B—B in FIG. 6A.
Figure 7A:
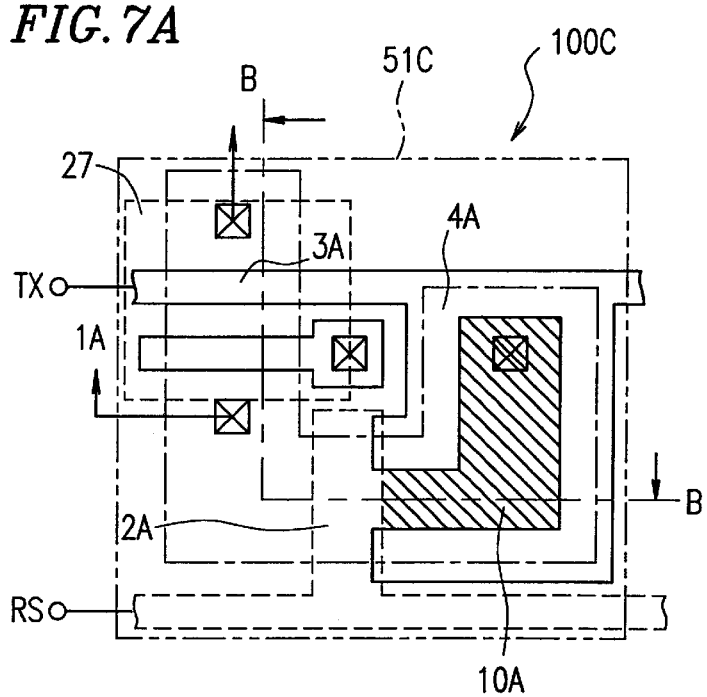
FIG. 7A is a diagram illustrating still another two-dimensional pattern of the amplified photoelectric transducer illustrated in FIG. 1A.
Figure 7B:
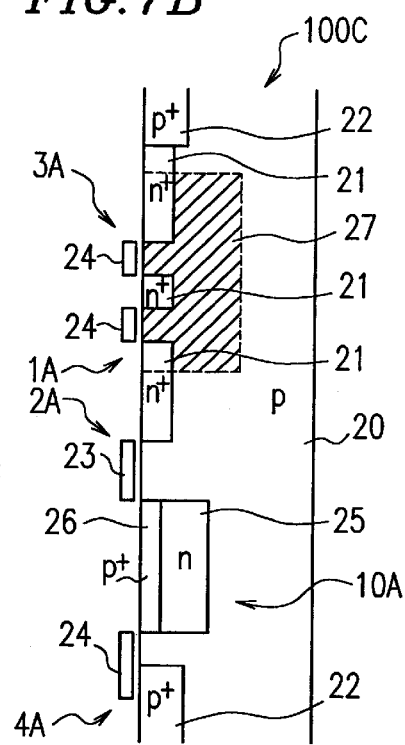
FIG. 7B is a cross-sectional view taken along line B—B in FIG. 7A.
Figure 8A:
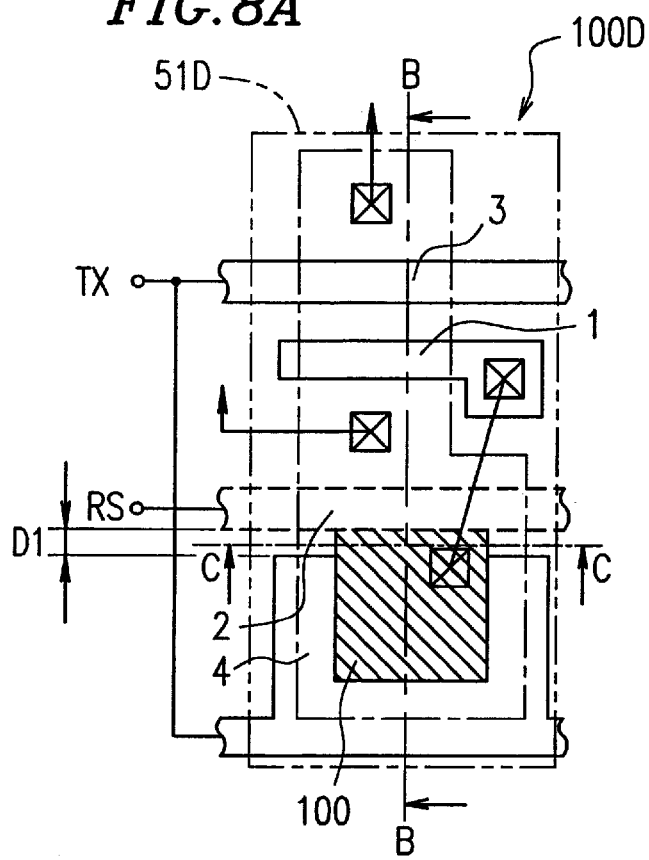
FIG. 8A is a diagram illustrating still another two-dimensional pattern of the amplified photoelectric transducer illustrated in FIG. 1A.
Figure 8B:
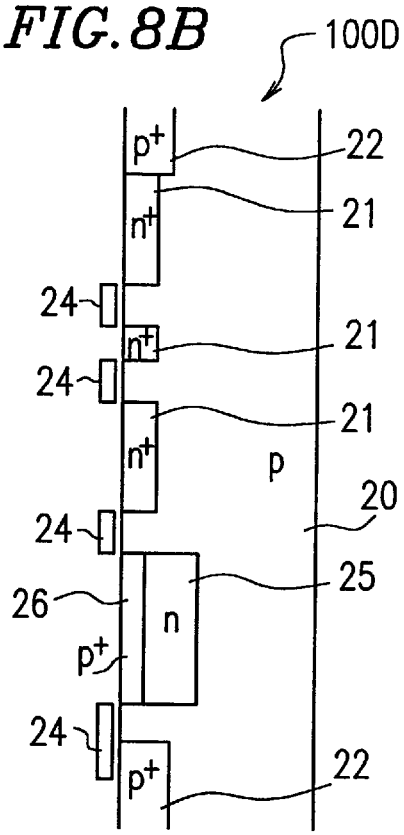
FIG. 8B is a cross-sectional view taken along line B—B in FIG. 8A.
Figure 8C:
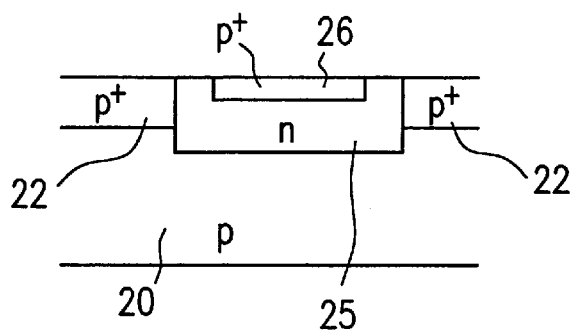
FIG. 8C is a cross-sectional view taken along line C—C in FIG. 8A.
Figure 9A:
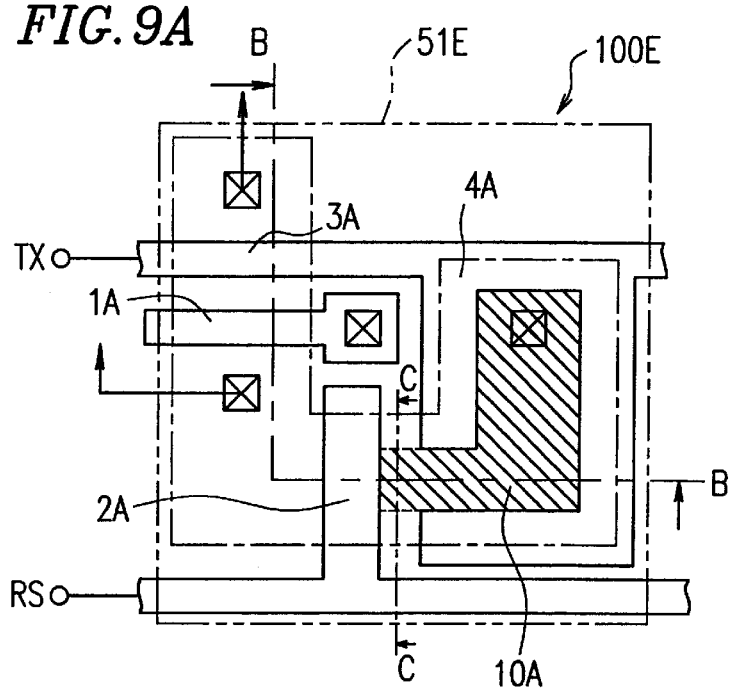
FIG. 9A is a diagram illustrating still another two-dimensional pattern of the amplified photoelectric transducer illustrated in FIG. 1A.
Figure 9B:
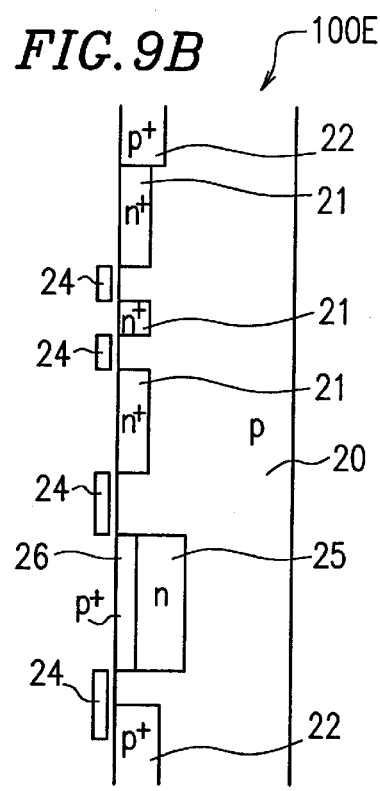
FIG. 9B is a cross-sectional view taken along line B—B in FIG. 9A.
Figure 9C:
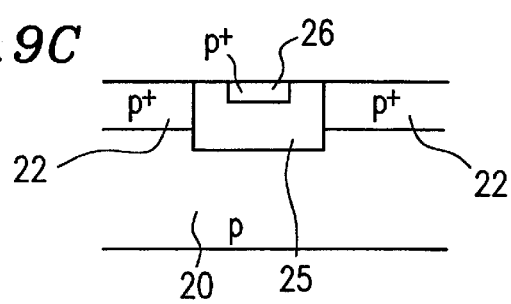
FIG. 9C is a cross-sectional view taken along line C—C in FIG. 9A.

FIGS. 6A and 6B illustrate an amplified photoelectric transducer 100B as a variation of the amplified photoelectric transducer illustrated in FIG. 2B. FIGS. 7A and 7B illustrate an amplified photoelectric transducer 100C as a variation of the amplified photoelectric transducer illustrated in FIG. 3B. Elements in FIGS. 6A, 6B and 7A and 7B having like reference numerals to those shown in FIGS. 2A, 2B, 3A and 3B will not be described below further.

In the amplified photoelectric transducers of FIGS. 6A, 6B and 7A and 7B, the p+ layer 27 is provided in addition to the elements illustrated in FIGS. 2A, 2B, 3A and 3B. The p+ layer 27 is provided in a region of the p-type substrate 20 where the first and third MOS transistors 1 and 3 are formed. The p+ layer 27 is formed of an impurity layer. The impurity concentration of the p+ layer 27 is higher than that in a region of the p-type substrate 20 where the fourth MOS transistor 4 and the p-n junction photodiode 10 (10A) are formed.

When the p+ layer 27 is sufficiently deeper than the n+ layer 21, while the impurity concentration of the p+ layer 27 is as high as that of the CMOS well (e.g., about $1\times10^{17}$ cm$^{31}$ 3) the impurity concentration of the p+ layer 27, corresponding to the impurity concentration of the p-type substrate, the first and third MOS transistors 1 and 3 will be substantially the same as that in the case where an ordinary CMOS process is employed. The p+ layer 27 can be formed by, for example, a high energy ion implantation of a p-type impurity, such as boron, before forming the electrodes 23 and 24.

EXAMPLE 4

In the amplified photoelectric transducers illustrated in FIGS. 2A, 2B, 3A and 3B, the electrode 24 of the fourth MOS transistor 4 and the electrode 23 of the second MOS transistor 2 overlap each other in a two-layer structure. However, a single-layer structure may be employed alternatively. FIGS. 8A to 8C and 9A to 9C illustrate amplified photoelectric transducers 100D and 100E, respectively, according to Example 4 of the present invention, in which the corresponding electrodes are provided in a single-layer structure.

When employing a single-layer structure, there is a gap D1 between the second MOS transistor 2 and the fourth MOS transistor 4. By filling this gap region with the n layer 25, the p+ layer 26 is separated from the pixel separation region 22, whereby it is possible to have the p+ layer 26 in a floating state when the p-type fourth MOS transistor 4 is turned OFF.

In Examples 1 to 4, the p-n junction photodiode 10 (10A) including the n layer 25 on the p-type substrate 20 and the p+ layer 26 on the n layer 25 is used as the photoelectric transducer section. However, the present invention is not limited thereto. It is only required for the photoelectric transducer section to include a signal charge storage section for storing a charge corresponding to an electric signal and a potential change detection section for detecting a change in the potential of the electric signal. It would be appreciated by those skilled in the art that the photoelectric transducer section is not limited to a p-n junction photodiode.

EXAMPLE 5

FIG. 10 illustrates an amplified solid-state image sensor 40 according to an example of the present invention. The amplified solid-state image sensor 40 is a two-dimensional solid-state image sensor where a plurality of amplified photoelectric transducers 100, as illustrated in FIG. 1A, are arranged in a matrix.

Referring to FIG. 10, the amplified photoelectric transducer 100 corresponds to one pixel. The read-out clock line 11, the reset clock line 12, the signal line 13 and the power line 14 extending from each amplified photoelectric transducer 100 are already shown in FIG. 1A and will not be described further.

Clock signals TX(i), TX(i+1), . . . , are applied to the read-out clock line 11 from a first vertical scanning circuit 102. Clock signals RS(i), RS(i+1), . . . , are applied to the reset clock line 12 from a second vertical scanning circuit 103. A supply voltage VD is supplied commonly to the power lines 14.

A MOS transistor 101 is connected to one end of each signal line 13. The MOS transistor 101 serves as a constant current load to the first amplification MOS transistor 1 which is an element in each amplified photoelectric transducer 100, whereby the output signal $\Delta$V2 is obtained on the signal line 13.

A correlated double sampling (CDS) circuit 41 is connected to the signal line 13. The CDS circuit 41 includes a clamp capacitance 104 and a clamp switching transistor 105. The supply voltage VCP provides a clamp potential. A sample and hold circuit 42 including a sample and hold switching transistor 106 and a sample and hold capacitor 107 is provided downstream of the CDS circuit 41.

Figure 11:
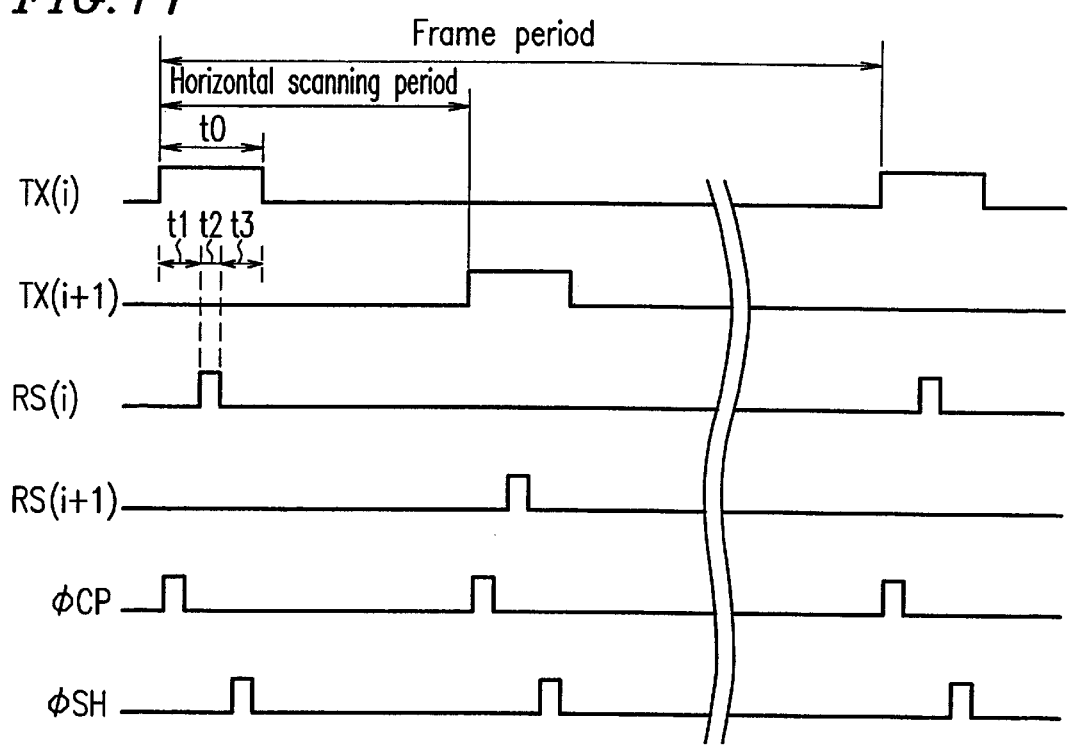
FIG. 11 is a timing diagram illustrating a signal read operation by the amplified solid-state image sensor illustrated in FIG. 10.

Referring to FIG. 11, an operation of the CDS circuit 41 will now be described. The clock signals TX(i), TX(i+1), . . . , from the first vertical scanning circuit 102 and the clock signals RS(i), RS(i+1), . . . , from the second vertical scanning circuit 103 are sequentially provided by horizontal scanning periods, whereby the clock signals TX(i), TX(i+1), . . . , and RS(i), RS(i+1), . . . , are repeated by frame periods.

FIG. 11 illustrates a case where the amplified photoelectric transducer 100 in the $i^{th}$ row is selected by the clock signal TX(i) for a period t0. In this case, a signal corresponding to the amount of signal charge ΔQ stored in the amplified photoelectric transducer 100 is obtained in a period t1. In a period t2, when the clock signal RS(i) is turned ON, the signal charge stored in the amplified photoelectric transducer 100 is reset. Thus, a signal with no signal charge in the amplified photoelectric transducer 100 is obtained in a period t3.

Therefore, the CDS circuit 41 clamps a signal in response to a clamp pulse ΦCP in the period t1, and the sample and hold circuit 42 samples and holds the signal in response to a sample and hold pulse ΦSH in the period t3. Thus, only a net signal component (e.g., the difference between a signal level when a signal charge is stored in the amplified photoelectric transducer 100 and a signal level when the signal charge is discharged) is recorded in the sample and hold capacitor 107.

Therefore, the amplified solid-state image sensor 40 of the present example cancels out the variation in the offset level among the amplified photoelectric transducers 100 due to, for example, the variation in characteristic among transistors used in the amplified photoelectric transducers 100. Thus, it is possible to obtain a high-resolution video signal.

Referring to FIG. 10, the sample and hold capacitors 107 are successively selected by MOS transistors 108 driven by a clock signal 109 from a horizontal scanning circuit so as to successively read out the net signals stored in the sample and hold capacitors 107 to a horizontal signal line 111. Finally, an output signal OS is obtained via an amplification circuit 112.

In the present example, the amplified photoelectric transducers 100 each having a structure illustrated in FIG. 1A are used in the amplified solid-state image sensor 40. Alternatively, the amplified photoelectric transducers 100A, 100B, 100C, 100D and 100E, as illustrated in FIGS. 3A, 6A, 7A, 8A and 9A, respectively, also may be used in the amplified solid-state image sensor of the present invention.

As described above, in the amplified solid-state image sensor employing the amplified photoelectric transducers of the present invention, the amplified photoelectric transducer substantially depletes the signal storage area by a reset operation. In accordance with the potential change in the signal storage area before and after a reset operation, the potential change in the signal storage area and a floating diffusion layer, which forms a p-n junction, is amplified by the amplification transistor and read out. Therefore, it is possible to amplify and read out a pure photoelectrically-transduced signal without substantial reset noise. In other words, a high-resolution video signal can be read out.

While the floating diffusion layer is formed on the surface side of the signal storage region, the potential of the floating diffusion layer is fixed at the ground potential while a photoelectric signal is being stored. Therefore, the semiconductor surface is not depleted, but rather filled with a large number of carriers and thus inactive, whereby dark current generation is suppressed to an extremely low level.

Moreover, in the amplified photoelectric transducer where the p-n junction photodiode and the first to third MOS transistors are arranged in a more folded pattern, the amplified photoelectric transducer (e.g., a cell of an amplified solid-state image sensor) can be shaped into a substantially square shape, which is advantageous in increasing the pixel density of the sensor. There are provided various other advantages such as: the area of the photoelectric transducer section can be easily ensured; the third MOS transistor 3 and the fourth MOS transistor 4 can easily be arranged to share a gate electrode, thereby reducing the pixel size; and a channel length of a second reset MOS transistor 2 can be easily ensured.

Furthermore, when a CDS circuit is provided along a signal line, the variation in the offset level among the amplified photoelectric transducers due to, for example, the variation in characteristic among transistors used in the amplified photoelectric transducers can be cancelled out, whereby it is possible to obtain a video signal having a higher resolution.

According to the method for driving the amplified solid-state image sensor of the present invention, during a signal read operation, it is possible to apply a single common clock to the gate electrode of the pixel selection transistor and to the gate electrode of the transistor for switching the floating diffusion layer. Therefore, when the amplified photoelectric transducers are arranged in a two-dimensional arrangement, the arrangement can be achieved in substantially the same manner as the conventional amplified photoelectric transducers. Thus, there is no structural complication introduced by the present invention.

As described above, the present invention provides an amplified photoelectric transducer having a simple arrangement and low noise, and an amplified solid-state image sensor incorporating such amplified photoelectric transducers.

In addition, the amplified photoelectric transducer of the present invention can be produced by an ordinary CMOS process, and thus can be integrated advantageously with peripheral circuits such as a driving circuit or a signal processing circuit. Thus, advantageous features of a CMOS image sensor can be obtained intact.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An amplified photoelectric transducer, comprising:

a photoelectric transducer section for photoelectrically transducing incident light into an electric signal;

a first MOS transistor for amplifying the electric signal;

a second MOS transistor for resetting the photoelectric transducer section; and a third MOS transistor for reading out to a signal line the amplified electric signal, wherein:

the photoelectric transducer section includes a signal charge storage section for storing a charge corresponding to the electric signal and a potential change detection section for detecting a potential change of the electric signal; and the amplified photoelectric transducer further comprises a fourth MOS transistor for switching the potential of the potential change detection section to a semiconductor substrate potential in response to an operation of the third MOS transistor.

2. An amplified photoelectric transducer according to claim 1, wherein:

the amplified photoelectric transducer is provided on a semiconductor substrate of a first conductivity type;

the photoelectric transducer section comprises a photodiode;

the photodiode comprises a first layer of a second conductivity type provided on the semiconductor substrate and a second layer of the first conductivity type provided on a surface side of the semiconductor substrate with respect to the first layer;

the first layer provides the signal charge storage section; and the second layer provides the potential change detection section.

3. An amplified photoelectric transducer according to claim 2, wherein:

the first MOS transistor, the second MOS transistor and the third MOS transistor each include a channel region of the second conductivity type; and the fourth MOS transistor includes a channel region of the first conductivity type.

4. An amplified photoelectric transducer according to claim 2, wherein:

the amplified photoelectric transducer further comprises a pixel separation region having a same potential as the potential of the semiconductor substrate; and the first layer and the second layer are separated from the pixel separation region via a gate electrode of the fourth MOS transistor and are in contact with a gate region of the second MOS transistor.

5. An amplified photoelectric transducer according to claim 4, wherein:

the gate electrode of the second MOS transistor and the gate electrode of the fourth MOS transistor are respectively formed by different electrode layers and overlap each other via an insulation film.

6. An amplified photoelectric transducer according to claim 2, wherein:

the amplified photoelectric transducer further comprises a pixel separation region having a same potential as the potential of the semiconductor substrate; and the second layer is separated from the pixel separation region via a gate electrode of the fourth MOS transistor and a portion of the first layer, and is in contact with a gate electrode of the second MOS transistor.

7. An amplified photoelectric transducer according to claim 6, wherein:

respective gate electrodes of the first, second, third and fourth MOS transistors are formed in a single layer.

8. An amplified photoelectric transducer according to claim 4, wherein:

the first MOS transistor, the second MOS transistor, the third MOS transistor and the first layer are serially connected to one another and are arranged in a folded pattern; and the amplified photoelectric transducer is shaped into a substantially square shape as viewed from above.

9. An amplified photoelectric transducer according to claim 5, wherein:

the first MOS transistor, the second MOS transistor, the third MOS transistor and the first layer are serially connected to one another and are arranged in a folded pattern; and the amplified photoelectric transducer is shaped into a substantially square shape as viewed from above.

10. An amplified photoelectric transducer according to claim 6, wherein:

the first MOS transistor, the second MOS transistor, the third MOS transistor and the first layer are serially connected to one another and are arranged in a folded pattern; and the amplified photoelectric transducer is shaped into a substantially square shape as viewed from above.

11. An amplified photoelectric transducer according to claim 2, wherein:

the first MOS transistor and the third MOS transistor are provided in a first region in the semiconductor substrate;

the second MOS transistor, the fourth MOS transistor and the photoelectric transducer section are provided in a second region in the semiconductor substrate; and an impurity layer of the first conductivity is provided in the first region, the impurity layer having an impurity concentration higher than an impurity concentration of the second region.

12. An amplified solid-state image sensor, comprising a plurality of amplified photoelectric transducers according to claim 1, wherein:

the amplified photoelectric transducers are arranged in a matrix;

a gate electrode of the third MOS transistor and a gate electrode of the fourth MOS transistor provided in each amplified photoelectric transducer are commonly connected by rows to a first driving line running in a first direction;

a gate electrode of the second MOS transistor provided in each amplified photoelectric transducer is connected by rows to a second driving line running in the first direction; and a source region of the third MOS transistor provided in each amplified photoelectric transducer is connected by columns to a signal line running in a second direction perpendicular to the first direction.

13. An amplified solid-state image sensor according to claim 12, further comprising:

a first vertical driving circuit connected to the first driving line;

a second vertical driving circuit connected to the second driving line; and a horizontal scanning circuit for selecting the signal line and reading out the electric signal from the amplified photoelectric transducer to a horizontal signal line.

14. An amplified solid-state image sensor according to claim 13, further comprising a correlated double sampling circuit provided between the amplified photoelectric transducer and the horizontal signal line.

15. A method for driving an amplified photoelectric transducer according to claim 2, the method comprising:

a first step of turning ON the fourth MOS transistor to connect a potential of the second layer to the semiconductor substrate potential, thereby storing a signal charge in the first layer;

a second step of, while the signal charge is stored in the first layer, turning OFF the fourth MOS transistor to bring the potential of the second layer to a floating state, thereby applying the potential of the second layer at this point of time to a gate electrode of the first MOS transistor and thus obtaining a first output signal;

a third step of, while maintaining the second layer in an electrically floating state, turning ON the second MOS transistor to reset and discharge the signal charge stored in the first layer to a power supply region, thereby applying the potential of the second layer immediately after the reset operation to the gate electrode of the first MOS transistor and thus obtaining a second output signal; and a fourth step of determining a difference between the first output signal and the second output signal to obtain an effective output signal of the amplified photoelectric transducer.

16. A method according to claim 15, wherein the third step comprises a fifth step of substantially depleting the first layer.

17. A method according to claim 16, further comprising a seventh step of setting an impurity concentration of the first layer and a potential of the gate of the second MOS transistor at the reset operation so as to substantially deplete the first layer.

* * * * *